United States Patent
Yang et al.

(10) Patent No.: US 9,197,398 B2
(45) Date of Patent: Nov. 24, 2015

(54) DISTRIBUTED PHASE-CORRECTION CIRCUIT

(71) Applicant: Oracle International Corporation, Redwood City, CA (US)

(72) Inventors: Suwen Yang, Mountain View, CA (US); Frankie Y. Liu, Palo Alto, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 0 days.

(21) Appl. No.: 14/090,989

(22) Filed: Nov. 26, 2013

(65) Prior Publication Data

US 2014/0314191 A1 Oct. 23, 2014

Related U.S. Application Data

(60) Provisional application No. 61/813,310, filed on Apr. 18, 2013.

(51) Int. Cl.
*H04L 7/00* (2006.01)
*H03K 5/134* (2014.01)
*H03L 7/00* (2006.01)

(52) U.S. Cl.
CPC .............. *H04L 7/0041* (2013.01); *H03K 5/134* (2014.07); *H04L 7/0008* (2013.01); *H03L 7/00* (2013.01)

(58) Field of Classification Search
None
See application file for complete search history.

(56) References Cited

U.S. PATENT DOCUMENTS

| | | | |
|---|---|---|---|
| 6,314,052 B2 * | 11/2001 | Foss et al. | 365/233.13 |
| 6,526,105 B1 * | 2/2003 | Harikumar et al. | 375/350 |
| 6,693,984 B1 * | 2/2004 | Andre | 375/350 |
| 6,788,752 B1 * | 9/2004 | Andre | 375/350 |
| 2002/0059536 A1 * | 5/2002 | Saeki | 713/500 |
| 2002/0176509 A1 * | 11/2002 | Gatherer et al. | 375/260 |
| 2002/0186714 A1 * | 12/2002 | Mestdagh | 370/480 |
| 2004/0239388 A1 * | 12/2004 | Lee | 327/158 |
| 2004/0258146 A1 * | 12/2004 | Harikumar et al. | 375/232 |
| 2005/0068886 A1 * | 3/2005 | Wang et al. | 370/210 |
| 2005/0206462 A1 * | 9/2005 | McCorquodale et al. | 331/57 |
| 2014/0091844 A1 * | 4/2014 | Jakobsson | 327/158 |

* cited by examiner

*Primary Examiner* — Leon-Viet Nguyen
*Assistant Examiner* — Sarah Hassan
(74) *Attorney, Agent, or Firm* — Park, Vaughan, Fleming & Dowler LLP; Steven E. Stupp

(57) ABSTRACT

A distributed phase-correction circuit is described. This distributed phase-correction circuit reduces jitter in a delay line by averaging edge delay through local feedback of signals internal to the delay line. In particular, the distributed phase-correction circuit includes a delay line with multiple cascaded first phase-alignment elements that each delay the input signal by a fraction of the period (i.e., that perform distributed phase correction) based on feedback signals from a second delay line.

20 Claims, 6 Drawing Sheets

DISTRIBUTED PHASE-CORRECTION CIRCUIT

CROSS REFERENCE TO RELATED APPLICATION

This application claims priority under 35 U.S.C. §119(e) to U.S. Provisional Application Ser. No. 61/813,310, entitled "Delay Locked Loop with Jitter Attenuating Local Feedback," by Frankie Y. Liu and Suwen Yang, filed on Apr. 18, 2013, the contents of which are herein incorporated by reference.

BACKGROUND

1. Field

The present disclosure generally relates to the design of circuits to transfer data between computer system components. More specifically, the present disclosure relates to the design of a distributed phase-correction circuit to reduce noise in the timing elements mediating the synchronization of data transfers between computer-system components.

2. Related Art

As the distance between computing/memory nodes continues to increase, long-distance off-chip and on-chip communication is becoming a more-prevalent concern for system designers. At the same time, in order to improve system performance, data rates are increasing. A common technology underlying this long-distance/fast data-rate communication facilitates the retiming of data via amplifying latches to restore signal integrity (e.g., such as in a transmitter and receiver setting, where the phases of the transmitting and receiving ends are arbitrary).

Retiming of synchronous data usually involves some form of phase adjustment of a local clock to synchronize it with the incoming data stream. During this process, the local clock is adjusted so as to sample at the middle (or within a time window) of the data eye (e.g., the edge from a delay-locked loop (DLL) must be within 5 ps of the ideal sampling point). Clock phase alignment is usually accomplished by using a phase-locked loop (PLL) or a DLL. Because faster data rates imply an ever-shrinking data eye, there is a corresponding tighter demand on the position of the sampling edges generated from PLLs and DLLs. Moreover, because noise inherent in systems tends to widen the phase window of PLLs and DLLs, this means that the distribution of edges around the ideal sampling point becomes wider, which makes it harder to meet the constraints of an edge falling in a certain time window. Therefore, lowering the output clock jitter from PLLs and DLLs is of paramount importance.

FIG. 1 presents a block diagram illustrating an existing DLL, which includes: a variable delay line, a filter, and a phase detector. The phase detector compares the arrival time of in and out at its inputs. The corresponding difference, in turn, is used to adjust the delay of the delay line (but with an integer number of cycles) so that edges of in and out align (if in is a periodic signal). The filter serves to accumulate and smooth out the phase errors from the phase detector. In this configuration, input jitter has the potential to be amplified at the output, because: each stage in the variable delay line accumulates and amplifies jitter from its preceding stage; the phase detector does not differentiate jitter between its two inputs, so that, when the inputs deviate in their response to external variations, the loop amplifies this deviation resulting in jitter peaking; and low-pass filtering in the control loop implies the loop is unable to respond to fast external fluctuations. As these problems are not decoupled, there is usually a trade-off in reducing the effects of one at the expense of another. For example, lowering the loop bandwidth reduces jitter peaking at the expense of being less responsive in tracking changes in the reference clock.

Two techniques have been proposed to reduce input-jitter amplification: loop and phase filtering. In loop filtering, a low-pass filter is introduced to filter out high-frequency jitter. This low-pass filter adds an extra pole in the loop response that, when taking loop stability into account, must be positioned at a relatively high frequency, thus diminishing its effectiveness. For phase filtering, a phase-domain filter, such as a ring oscillator, is used to reduce high-frequency jitter, while making jitter peaking more prevalent. A time-shifted averaging voltage-controlled delay line (VCDL) may be used to correct for duty-cycle errors and device mismatch. In addition, this VCDL generates precise multi-phase timing signals. However, this implementation suffers from start-up and locking problems, because it is configured with forward and backward loops, allowing for multiple stable operating regions, which prevents the circuit from locking to a unique state. Alternatively, a similar time-averaging circuit may be used, but with local feedback removed to avoid start-up problems. Instead, two rounds of the time averaging are used to reduce the jitter. Jitter, however, can still be amplified through the delay line, and extra power must be consumed to maintain the outputs within specification. In another approach, a surfing inverter has been proposed to serve as both the phase detector and the delay element, such that the jitter is attenuated while traversing the delay line. However, the locking range for this design is somewhat limited.

Hence, what is needed is a phase-alignment circuit without the above-described problems.

SUMMARY

One embodiment of the present disclosure provides a distributed phase-correction circuit. This distributed phase-correction circuit includes: an input node that receives an input signal having a period; and a first delay line, coupled to the input node and a second delay line, which provides an output signal. The first delay line includes: multiple cascaded first phase-alignment elements that each delay the input signal by a fraction of the period, where a given first phase-alignment element receives a delayed instance of the input signal from a previous first phase-alignment element in the cascaded first phase-alignment elements and a given feedback signal from the second delay line. Moreover, the given feedback signal controls a phase of the given first phase-alignment element, and the given first phase-alignment element provides a further delayed instance of the input signal to a subsequent first phase-alignment element in the cascaded first phase-alignment elements.

Furthermore, the distributed phase-correction circuit includes the second delay line, coupled to the first delay line, which receives the output signal, controls phases of the first phase-alignment elements and provides a second output signal. The second delay line includes: multiple cascaded second phase-alignment elements that each delay the input signal by the fraction of the period, where, on two input nodes, a given second phase-alignment element receives a delayed instance of the input signal from a previous second phase-alignment element in the cascaded second phase-alignment elements. Additionally, the given second phase-alignment element provides a further delayed instance of the input signal to a subsequent second phase-alignment element in the cascaded second phase-alignment elements and to the given first phase-alignment element as the given feedback signal.

Note that the first delay line and the second delay line successively correct phases associated with edges in the input signal so that edges in the output signal have an average phase, where the average phase corresponds to an average of the phases of the edges in the input signal.

Moreover, a given delayed instance of the input signal (which can include one of: the delayed instance of the input signal in the first delay line, the further delayed instance of the input signal in the first delay line, the delayed instance of the input signal in the second delay line and the further delayed instance of the input signal in the second delay line) corresponds to an inverse of an integer multiple of a half-period delayed edge in the input signal. For example, the integer multiple may be one.

Furthermore, the given first phase-alignment element may have the same geometry as the given second phase-alignment element.

The distributed phase-correction circuit may reduce duty-cycle jitter in the input signal and jitter associated with a fabrication process and temperature variation. Additionally, the jitter may be reduced without separate feedback loops for the duty-cycle jitter and for the jitter associated with the fabrication process and the temperature variation.

Another embodiment provides an electronic device that includes the distributed phase-correction circuit.

Another embodiment provides a method for successively correcting a phase of edges in the input signal so that edges in the output signal have an average phase corresponding to an average of the phases of the edges in the input signal. During the method, the input signal having the period is received. Then, the phase is successively corrected using the first delay line and the second delay line. Note that successively correcting the phase involves: successively delaying the input signal by the fraction of the period using the multiple cascaded second phase-alignment elements in the second delay line; providing the delayed instances of the input signal as feedback signals to the multiple cascaded first phase-alignment elements in the first delay line, where the phase of the given first phase-alignment element is based on the given feedback signal from the second delay line; and successively delaying the input signal by the fraction of the period using the first phase-alignment elements. Next, the output signal is provided using the second delay line.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Embodiments of a distributed phase-correction circuit, an electronic device that includes the distributed phase-correction circuit, and method for successively correcting a phase of edges in an input signal are described. This distributed phase-correction circuit reduces jitter in a delay line by averaging edge delay through local feedback of signals internal to the delay line. In particular, the distributed phase-correction circuit includes a delay line with multiple cascaded first phase-alignment elements that each delay the input signal by a fraction of the period (i.e., that collectively perform distributed phase correction) based on feedback signals from a second delay line.

By reducing jitter, the distributed phase-correction circuit facilitates phase-alignment blocks, such as delay-locked loops (DLLs), with improved performance. Therefore, the distributed phase-correction circuit can enable high-speed links with increased data rates for use in intra-chip and inter-chip communication.

We now describe embodiments of the distributed phase-correction circuit. In the discussion that follows, the term 'phase alignment' is broadly used to encompass the repositioning of edges in one signal with respect to edges in another 'reference' signal. As described further below with reference to FIG. 3, a phase-alignment element is described and its operation is exemplified in context. A recurring theme in this discussion is the use of phase alignment via temporal- and spatial-mixing/multiplexing. Both of these forms of mixing are described as performing 'distributed' phase correction, and the phase-alignment element is used to either enhance or add additional functionality to a timing block, such as a DLL. In particular, for a voltage-controlled delay line in a DLL, the distributed mixing reduces both jitter and duty cycle disturbances.

Figure 2:
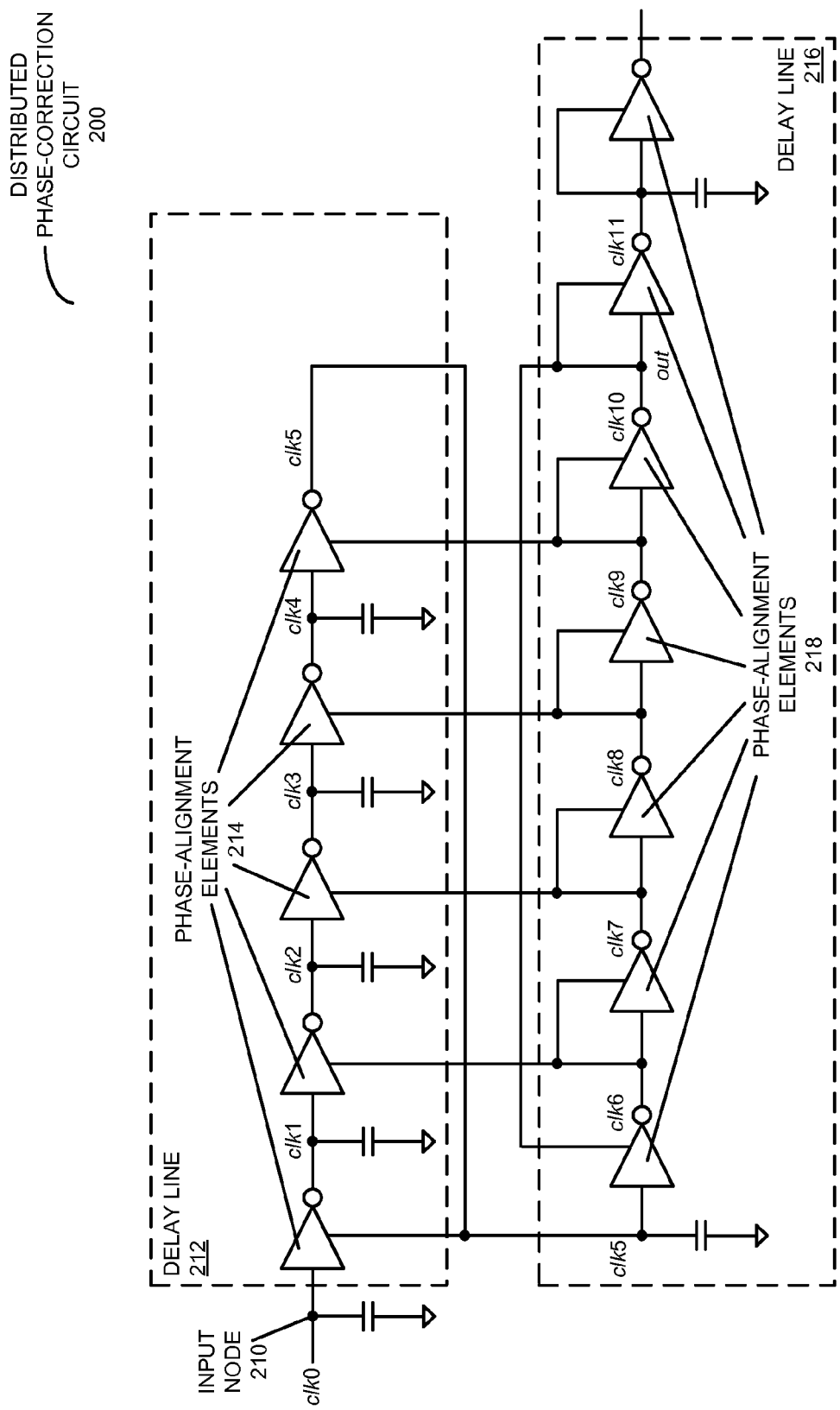
FIG. 2 is a block diagram illustrating a distributed phase-correction circuit in accordance with an embodiment of the present disclosure.

FIG. 2 presents a block diagram illustrating a distributed phase-correction circuit 200, which performs the function of a voltage-controlled delay line (VCDL). This distributed phase-correction circuit includes: an input node 210 that receives an input signal (clk0) having a period; and a delay line 212, coupled to input node 210 and a delay line 216, which provides an output signal (clk5). Delay line 212 includes: multiple cascaded phase-alignment elements 214 that each delay clk0 by a fraction of the period (i.e., that perform the distributed phase correction), where a given one of phase-alignment elements 214 receives a delayed instance of clk0 (such as clk1, clk2, clk3 or clk4) from a previous one of phase-alignment elements 214 and a given feedback signal from delay line 216 (such as clk6, clk7, clk8 or clk9). Moreover, the given feedback signal controls a phase of the given one of phase-alignment elements 214, and the given one of phase-alignment elements 214 provides a further delayed instance of clk0 to a subsequent one of phase-alignment elements 214. (Note that the phase adjustment performed by phase-alignment elements 214 is also a function of or dependent on the supply voltage, Vc.)

Furthermore, delay line 216, which is coupled to delay line 212, receives clk5, controls the phases of phase-alignment elements 214 and provides a second output signal. Delay line 216 includes: multiple cascaded phase-alignment elements 218 that each delay a version of clk0 (such as clk5, clk6, clk7, clk8 or clk9) by the fraction of the period, where, on two input nodes, a given one of phase-alignment elements 218 receives a delayed instance of clk0 from a previous one of phase-alignment elements 218. (Therefore, the architecture or geometry of phase-alignment elements 218 may be the same as phase-alignment elements 214. In addition, as illustrated in FIG. 2, in order to maintain symmetric loads across all stages, dummy devices, represented as capacitors, may be added to the first half of delay line 212 and to the final stage of delay line 216.) Additionally, the given one of phase-alignment elements 218 provides a further delayed instance of clk0 (such as clk6, clk7, clk8, clk9 or clk10) to a subsequent one of phase-alignment elements 218 and to the given one of phase-alignment elements 214 as the given feedback signal. Thus, a feedback signal from the 'past' in clk0 is used to control the delay (and, thus, the phase) of the 'present' in clk0. Stated differently, distributed phase-correction circuit 200 includes feedback for later stages to preceding stages.

Moreover, a given delayed instance of clk0 (which can include one of: the delayed instance of clk0 in delay line 212, the further delayed instance of clk0 in delay line 212, the delayed instance of clk0 in delay line 216, and the further delayed instance of clk0 in delay line 216) corresponds to an inverse of an integer multiple of a half-period delayed edge in clk0. For example, the integer multiple may be one. Furthermore, this may allow distributed phase-correction circuit 200 to lock at a delay of exactly one period of clk0.

In this way, the feedback is exactly spaced to feedback an earlier edge to the current edge, i.e., in the ideal (no noise) scenario, the fed back past edge exactly coincides with the present edge. As discussed further below with reference to FIG. 3, consequently in the ideal (no noise) scenario, the difference of the timing of the input signal in ($t_{in}$) and the timing of a control signal ctrl ($t_{ctrl}$) to a phase-alignment element is zero, and this sets the equilibrium 'zero-point delay' through the phase-alignment element. Note that zero-point delay means that, for deviations from this zero point (i.e., when $t_{ctrl}$ differs from $t_{in}$), the phase-alignment element pushes $t_{in}$ toward $t_{ctrl}$, thus removing or filtering clk0.

Note that delay lines 212 and 216 successively correct phases associated with edges in clk0 so that edges in the output signal have an average phase, where the average phase corresponds to an average of the phases of the edges in clk0. In particular, in the locked state of distributed phase-correction circuit 200, clk0 and clk5 are nominally phase aligned. Because each stage in delay lines 212 and 216 has the same delay, subsequent stage outputs are also phase aligned, i.e., clk1 to clk6, clk2 to clk7, etc. Therefore, an edge from delay line 216 can act as the ctrl input to align an edge from delay line 212. With each lower/upper coupling, an edge traversing delay line 212 is brought closer to the ctrl edge from delay line 216. Delay line 216 stores an 'averaged' edge, which through averaging is made much cleaner than an edge entering distributed phase-correction circuit 200.

Note that distributed phase-correction circuit 200 may reduce duty-cycle jitter in the input signal and jitter associated with a fabrication process and a temperature variation. Additionally, the jitter may be reduced without separate feedback loops for the duty-cycle jitter and for the jitter associated with the fabrication process and the temperature variation.

Figure 1:
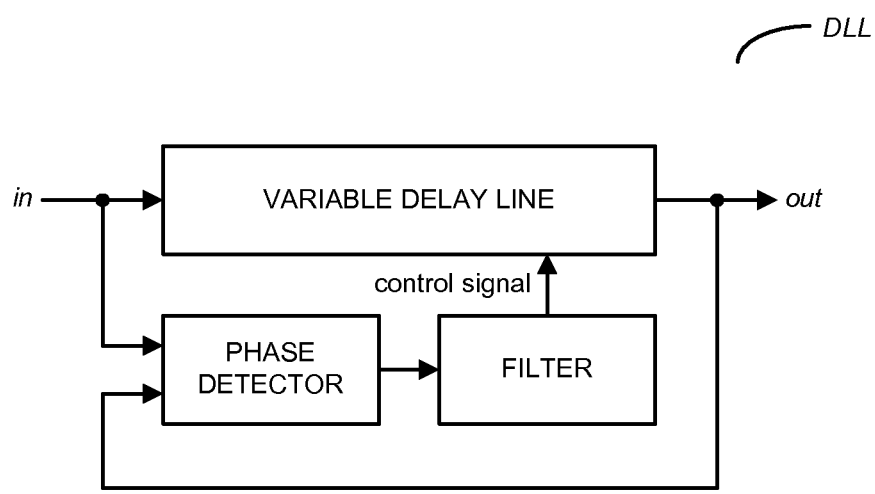
FIG. 1 is a block diagram illustrating an existing delay-locked loop (DLL).
Figure 3:
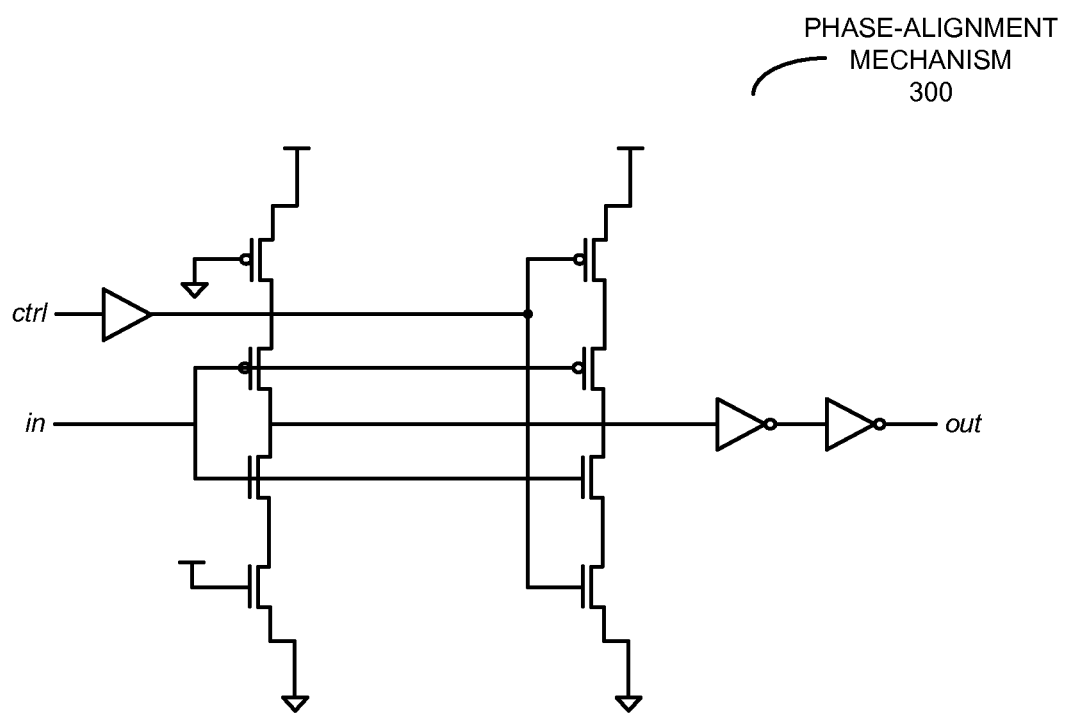
FIG. 3 is a block diagram illustrating a phase-alignment element in accordance with an embodiment of the present disclosure.

FIG. 3 presents a block diagram illustrating a phase-alignment element 300. This is the 'delay element' in delay lines 212 and 216 (FIG. 2). There are actually three inputs to phase-alignment element 300, not counting ground: Vc that sets the delay through phase-alignment element 300, and the two inputs ctrl and in. In the discussion that follows, it is assumed that a DLL, such as the DLL shown in FIG. 1, sets the supply rail correctly to lock the delay through all stages at a clock period. In phase-alignment element 300, the ctrl input is used to retard or advance the phase of in to remove jitter (noise) coming through the input.

Of the inputs other than Vc, in corresponds to the main input-signal path, and ctrl corresponds to the control path in charge of adjusting the edge positions along the main input-signal path. If in arrives earlier than ctrl, phase-alignment element 300 delays the output signal (out) and vice versa. Moreover, phase-alignment element 300 is insensitive to the edges in ctrl when in is quiet. Stated differently, when in has a constant value such as hi or lo, the enabling and disabling via ctrl does not affect the value at the output node, except through minor disturbances from the gate to drain feedthrough of the ctrl signal. It follows that the extent of influence on the output delay from a ctrl edge is determined by its relative overlap in time with an in edge.

Figure 4:
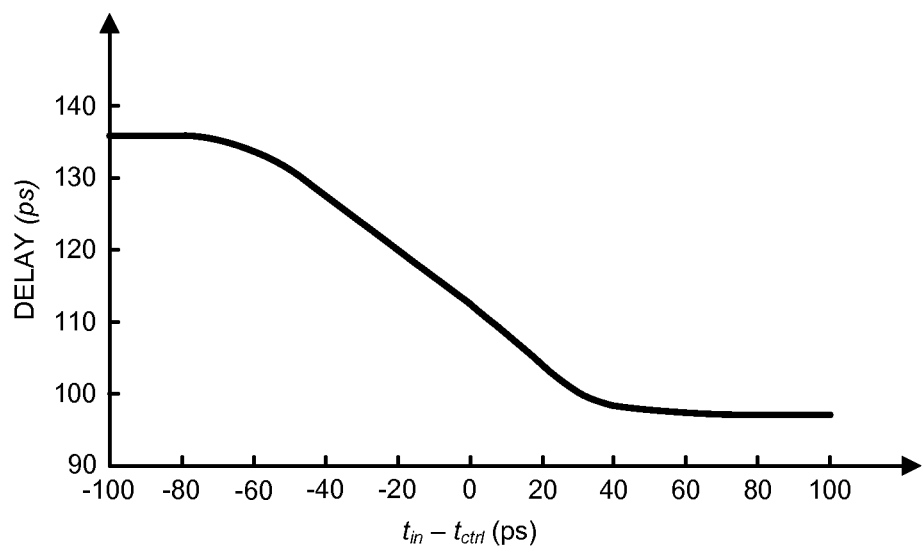
FIG. 4 is a drawing illustrating a transfer function of the phase-alignment element in FIG. 3 in accordance with an embodiment of the present disclosure.

FIG. 4 presents a drawing illustrating a transfer function of phase-alignment element 300 (FIG. 3). In particular, the transfer function, which is a measure of the ctrl input in FIG. 3 to advance or delay the edge from the in input in FIG. 3, is the output delay as a function of $t_{ctrl}-t_{in}$, where t corresponds to time when the associated edges cross the 50%-level mark, i.e., $$\frac{Vhi+Vlo}{2}.$$

In the present discussion, the term 'edge' may be used interchangeably with the 50% crossing time. The gain of the phase-alignment element ($\alpha$) may be defined as the change in the time of the output signal ($t_{out}$) for a given change in $t_{ctrl}-t_{in}$, $$\alpha = \frac{\Delta t_{out}}{\Delta(t_{ctrl}-t_{in})}. \quad (1)$$

As shown in FIG. 4, at the extremes of the transfer function, where $|t_{ctrl}-t_{in}|$ is greater than the edge overlap, the gain is zero.

Referring back to FIG. 3, the two leftmost transistor stacks, making up the front end of phase-alignment element 300, are essentially a surfing inverter. In this example, all the NMOS and PMOS transistor widths may be the same. The left stack of transistors may always be enabled. However, the right one may only be enabled when ctrl is asserted. The two transistor stacks share a common drain or summation point. For exemplary transistor widths, the gain, as previously defined, is roughly 0.4 (ps/ps). In order to keep the output slew rate independent of the phase difference, $t_{ctrl}-t_{in}$, a buffer may be inserted after the summing point. Furthermore, to center the response in FIG. 4, i.e., for maximum gain/dynamic range at zero phase difference, the ctrl signal may be delayed appropriately by a buffer as shown in FIG. 3. This buffer also makes the delay less sensitive to the edge rate of ctrl. In the context of a DLL, phase-alignment element 300 operates under a wide range of power-supply levels. With increasing Vc, the edges become sharper, thereby decreasing the overlap region where the gain is non-zero. In general, the delay decreases as Vc increases.

Based on the preceding discussion, phase-alignment element 300 may be viewed as having an 'averaging' effect on two edges. For example if ctrl is a clean reference clock signal and in is a dirty signal, then through the coupling of ctrl via phase-alignment element 300, edges of in are averaged with those on ctrl and are cleaned in the process. If two or more stages are concatenated back to back, with ctrl suitably delayed between stages, then the jitter in the main path can be effectively removed. This delay is implicit as in a surfing pipeline, where the data (in) and clock (ctrl) share similar paths. Similarly, in a DLL, there exists a fixed delay for each stage in the VCDL, set by the outer control loop.

Note that, at the beginning of the delay line, the cycle jitter is $\sqrt{2}$ bigger than the absolute edge jitter, because the input edges are uncorrelated. As the edges progress through the delay line, not only do they converge toward the ideal but also toward each other through the feedback, further reinforcing their half-cycle separation. In this way, the edges reflect a stronger driving force in removing cycle jitter versus absolute jitter.

In an exemplary embodiment, the distributed phase-correction circuit is used as the VCDL in a delay-locked loop (DLL), which is sometimes referred to as a 'DLL with jitter-attenuating local feedback.' In particular, local feedback may be used to filter high-frequency jitter from the input. This design uses the fixed delay in the VCDL to generate the local feedback signals, makes use of single-rail clock signals and removes feed-forward paths to alleviate start-up problems and to reduce the overall jitter.

The DLL with jitter-attenuating local feedback can be used in conjunction with noise-isolation and cancellation techniques, which are usually guaranteeing a certain amount of uncertainty on the edges at the input of the DLL. That is, these techniques may be used to reduce the noise of the clock external to the DLL. However, the distributed phase-correction circuit takes the input clock and further filters the input clock within the DLL. Because the filtering is internal to the DLL, it can be quite effective and may, therefore, reduce some of the requirements on noise isolation and cancellation external to the DLL.

Thus, in these embodiments the DLL itself may be used in noise reduction. Moreover, the filtering technique within the DLL may employ multiple feedback loops to reduce the noise. Furthermore, the distributed phase-correction circuit may reduce the duty-cycle jitter either from the input clock and/or from process/temperature variation (as opposed to having a separate circuit just for the duty-cycle correction).

In the context of a DLL, the phase-alignment element serves as the stage elements in a VCDL. In contrast with conventional delay line made of inverters, the disclosed delay line with distributed phase-correction feedback is capable of attenuating high frequency input jitter. The total 'phase' gain-correction factor of the VCDL is $\alpha^n$, where n is the number of loops in the delay line, and $\alpha$ is the gain of a single stage. The first half of the delay line behaves as a low-pass filter, while the second half propagates the previously filtered output to serve as a feedback for the first half.

Figure 5:
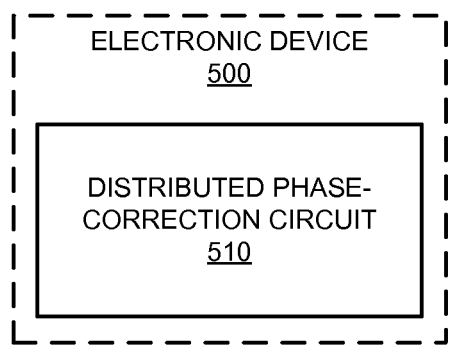
FIG. 5 is a block diagram of an electronic device that includes the distributed phase-correction circuit of FIG. 2 in accordance with an embodiment of the present disclosure.

We now describe embodiments of the electronic device. FIG. 5 presents a block diagram of an electronic device 500 that includes a distributed phase-correction circuit 510, such as distributed phase-correction circuit 200 (FIG. 2).

More generally, embodiments of the distributed phase-correction circuit may be used in a variety of applications, including: VLSI circuits, communication systems, storage area networks, data centers, networks (such as local area networks), memory components (such as those that include a high input/output or I/O count), memory systems, and/or computer systems (such as multiple-core processor computer systems, computer systems that include components that communicate via capacitive proximity communication, computer systems that include components that communicate via optical proximity communication, etc.). Note that electronic device 600 may include, but is not limited to: a DLL, a high-speed I/O circuit, an integrated circuit, a server, a laptop computer, a communication device or system, a personal computer, a work station, a mainframe computer, a blade, an enterprise computer, a data center, a tablet computer, a portable-computing device, a supercomputer, a network-attached-storage (NAS) system, a storage-area-network (SAN) system, a cellular telephone, a smartphone, a media player (such as an MP3 player), an appliance, a subnotebook/netbook, a network appliance, a set-top box, a personal digital assistant (PDA), a toy, a controller, a digital signal processor, a game console, a device controller, a computational engine within an appliance, a consumer-electronic device, a portable electronic device, a personal organizer, and/or another electronic device. Moreover, note that a given computer system may be at one location or may be distributed over multiple, geographically dispersed locations.

The preceding embodiments may include fewer components or additional components. Although these embodiments are illustrated as having a number of discrete items, these circuits and devices are intended to be functional descriptions of the various features that may be present rather than structural schematics of the embodiments described herein. Consequently, in these embodiments two or more components may be combined into a single component, and/or a position of one or more components may be changed. Furthermore, note that circuits in these embodiments may be implemented using PMOS and/or NMOS, and signals may include digital signals that have approximately discrete values and/or analog signals that have continuous values.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in: Caltech Intermediate Format (CIF), Calma GDS II Stream Format (GDSII) or Electronic Design Interchange Format (EDIF). Those of skill in the art of integrated circuit design can develop such data structures from schematics of the type detailed above and the corresponding descriptions and encode the data structures on a computer-readable medium. Those of skill in the art of integrated circuit fabrication can use such encoded data to fabricate integrated circuits comprising one or more of the circuits described herein.

Figure 6:
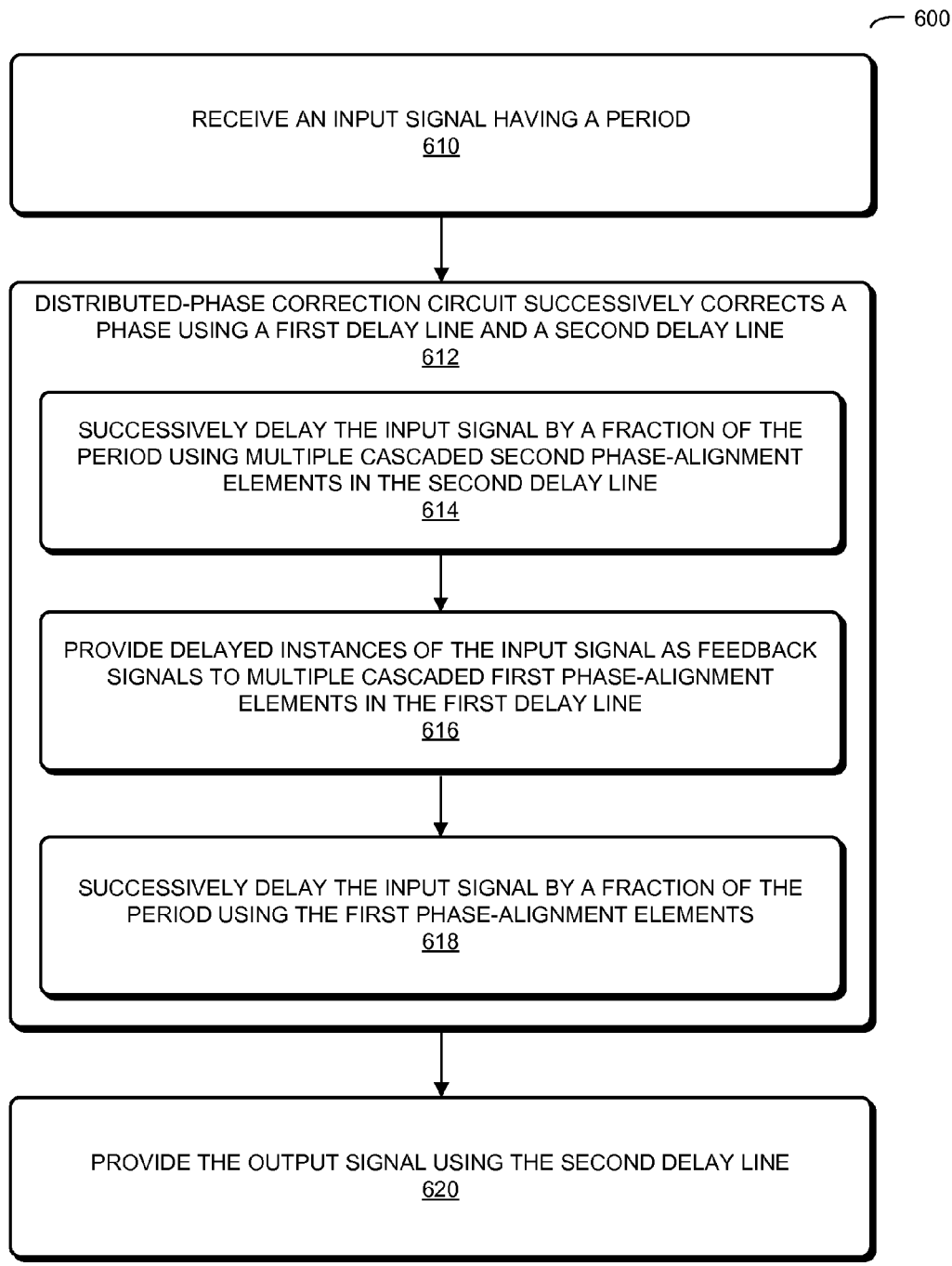
FIG. 6 is a flow chart illustrating a method for successively correcting a phase of edges in an input signal so that edges in an output signal have an average phase corresponding to an average of the phases of the edges in the input signal using a distributed phase-correction circuit in accordance with an embodiment of the present disclosure.

We now describe embodiments of a method. FIG. 6 presents a flow chart illustrating a method 600 for successively correcting a phase of edges in an input signal so that edges in an output signal have an average phase corresponding to an average of phases of the edges in the input signal, which may be performed by a distributed phase-correction circuit (such as distributed phase-correction circuit 200 in FIG. 2). During the method, the distributed phase-correction circuit receives the input signal having a period (operation 610). Then, the distributed phase-correction circuit successively corrects the phase using a first delay line and a second delay line (operation 612). Note that successively correcting the phase involves: successively delaying the input signal by a fraction of the period using multiple cascaded second phase-alignment elements in the second delay line (operation 614); providing the delayed instances of the input signal as feedback signals to multiple cascaded first phase-alignment elements in the first delay line (operation 616), where a phase of a given first phase-alignment element is based on a given feedback signal from the second delay line; and successively delaying the input signal by the fraction of the period using the first phase-alignment elements (operation 618). Next, the distributed phase-correction circuit provides the output signal using the second delay line (operation 620).

In some embodiments of method 600, there are additional or fewer operations. For example, by generalizing method 600 to more than two delay lines, it is possible to apply the same feedback technique as long as the same phases are added together. Thus, a third (or fourth, or fifth) delay lines may be used, all of which provide a delay one-half of the clock period and which use the intermediate signals from the delay lines as feedback to any of the preceding stages (or phase-alignment elements). In these embodiments, the overall delay through all the delay lines and/or the phase-alignment elements may be more than one clock period, but still may be an integer number of half-cycles. Moreover, the order of the operations may be changed, and/or two or more operations may be combined into a single operation.

While the preceding embodiments illustrated the distributed phase-correction circuit with two delay lines, in other embodiments the phase-alignment technique may use an arbitrary number of samples within a period and/or an arbitrary number of delay paths to adjust the phases of edges. More generally, a group of samples that share something similar with another group of samples (for example, at a different time within a period) may be used to perform a correction, such as a phase adjustment.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A distributed phase-correction circuit, comprising:
    an input node configured to receive an input signal having a period;
    a first delay line, coupled to the input node and a second delay line, configured to provide an output signal, wherein the first delay line includes:
        multiple cascaded phase-alignment elements, each configured to delay the input signal by a fraction of the period, wherein a given phase-alignment element in the cascaded phase-alignment elements is configured to receive a delayed instance of the input signal from a previous phase-alignment element in the cascaded phase-alignment elements and a given feedback signal from the second delay line;
        wherein the given feedback signal controls a phase of the given phase-alignment element; and
        wherein the given phase-alignment element is configured to provide a further delayed instance of the input signal to a subsequent phase-alignment element in the cascaded phase-alignment elements; and
    the second delay line, coupled to the first delay line, configured to receive the output signal, to control phases of the phase-alignment elements for the first delay line and to provide a second output signal, wherein the second delay line includes:
        multiple cascaded phase-alignment elements, each configured to delay the input signal by the fraction of the period, wherein, on two input nodes, a given phase-alignment element in the cascaded phase-alignment elements for the second delay line is configured to receive a delayed instance of the input signal from a previous phase-alignment element in the cascaded second phase-alignment elements for the second delay line; and
        wherein the given phase-alignment element for the second delay line is configured to provide a further delayed instance of the input signal to a subsequent phase-alignment element in the cascaded phase-alignment elements for the second delay line and to the given phase-alignment element for the first delay line as the given feedback signal,
    wherein a first of the phase-alignment elements in the second delay line receives an output of a last of the phase-alignment elements in the first delay line, wherein the output of the last of the phase-alignment elements in the first delay line controls a phase of a first of the phase-alignment elements in the first delay line, and wherein the first of the phase-alignment elements in the first delay line receives the input signal.

2. The distributed phase-correction circuit of claim 1, wherein the first delay line and the second delay line successively correct phases associated with edges in the input signal so that edges in the output signal have an average phase; and
    wherein the average phase corresponds to an average of the phases of the edges in the input signal.

3. The distributed phase-correction circuit of claim 1, wherein a given delayed instance of the input signal, which includes one of the delayed instance of the input signal in the first delay line, the further delayed instance of the input signal in the first delay line, the delayed instance of the input signal in the second delay line and the further delayed instance of the input signal in the second delay line, corresponds to an inverse of an integer multiple of a half-period delayed edge in the input signal.

4. The distributed phase-correction circuit of claim 3, wherein the integer multiple equals one.

5. The distributed phase-correction circuit of claim 1, wherein the given phase-alignment element for the first delay line has the same geometry as the given phase-alignment element for the second delay line.

6. The distributed phase-correction circuit of claim 1, wherein the distributed phase-correction circuit is configured to reduce duty-cycle jitter in the input signal and jitter associated with a fabrication process and a temperature variation.

7. The distributed phase-correction circuit of claim 6, wherein the jitter is reduced without separate feedback loops for the duty-cycle jitter and for the jitter associated with the fabrication process and the temperature variation.

8. An electronic device, comprising: a distributed phase-correction circuit, wherein the distributed phase-correction circuit includes:
    an input node configured to receive an input signal having a period;

a first delay line, coupled to the input node and a second delay line, configured to provide an output signal, wherein the first delay line includes:
multiple cascaded phase-alignment elements, each configured to delay the input signal by a fraction of the period, wherein a given phase-alignment element in the cascaded phase-alignment elements is configured to receive a delayed instance of the input signal from a previous phase-alignment element in the cascaded first phase-alignment elements and a given feedback signal from the second delay line;
wherein the given feedback signal controls a phase of the given phase-alignment element; and
wherein the given phase-alignment element is configured to provide a further delayed instance of the input signal to a subsequent phase-alignment element in the cascaded phase-alignment elements; and
the second delay line, coupled to the first delay line, configured to receive the output signal, control phases of the phase-alignment elements for the first delay line and to provide a second output signal, wherein the second delay line includes:
multiple cascaded phase-alignment elements, each configured to delay the input signal by the fraction of the period, wherein, on two input nodes, a given phase-alignment element in the cascaded phase-alignment elements for the second delay line is configured to receive a delayed instance of the input signal from a previous phase-alignment element in the cascaded second phase-alignment elements for the second delay line; and
wherein the given phase-alignment element for the second delay line is configured to provide a further delayed instance of the input signal to a subsequent phase-alignment element in the cascaded phase-alignment elements for the second delay line and to the given phase-alignment element for the first delay line as the given feedback signal,
wherein a first of the phase-alignment elements in the second delay line receives an output of a last of the phase-alignment elements in the first delay line, wherein the output of the last of the phase-alignment elements in the first delay line controls a phase of a first of the phase-alignment elements in the first delay line, and wherein the first of the phase-alignment elements in the first delay line receives the input signal.

9. The electronic device of claim 8, wherein the first delay line and the second delay line successively correct phases associated with edges in the input signal so that edges in the output signal have an average phase; and
wherein the average phase corresponds to an average of the phases of the edges in the input signal.

10. The electronic device of claim 8, wherein a given delayed instance of the input signal, which include one of the delayed instance of the input signal in the first delay line, the further delayed instance of the input signal in the first delay line, the delayed instance of the input signal in the second delay line and the further delayed instance of the input signal in the second delay line, corresponds to an inverse of an integer multiple of a half-period delayed edge in the input signal.

11. The electronic device of claim 10, wherein the integer multiple equals one.

12. The electronic device of claim 8, wherein the given phase-alignment element for the first delay line has the same geometry as the given phase-alignment element for the second delay line.

13. The electronic device of claim 8, wherein the distributed phase-correction circuit is configured to reduce duty-cycle jitter in the input signal and jitter associated with a fabrication process and a temperature variation.

14. The electronic device of claim 13, wherein the jitter is reduced without separate feedback loops for the duty-cycle jitter and for the jitter associated with the fabrication process and the temperature variation.

15. A method for successively correcting a phase of edges in an input signal so that edges in an output signal have an average phase corresponding to an average of the phases of the edges in the input signal, wherein the method comprises:
receiving an input signal having a period;
successively correcting the phase using a first delay line and a second delay line, wherein successively correcting the phase involves:
successively delaying the input signal by a fraction of the period using multiple cascaded phase-alignment elements in the second delay line;
providing the delayed instances of the input signal as feedback signals to multiple cascaded phase-alignment elements in the first delay line, wherein a phase of a given phase-alignment element in the first delay line is based on a given feedback signal from the second delay line; and
successively delaying the input signal by a fraction of the period using the first phase-alignment elements; and
providing the output signal using the second delay line,
wherein a first of the phase-alignment elements in the second delay line receives an output of a last of the phase-alignment elements in the first delay line, wherein the output of the last of the phase-alignment elements in the first delay line controls a phase of a first of the phase-alignment elements in the first delay line, and wherein the first of the phase-alignment elements in the first delay line receives the input signal.

16. The method of claim 15, wherein a given delayed instance of the input signal corresponds to an inverse of an integer multiple of a half-period delayed edge in the input signal.

17. The method of claim 16, wherein the integer multiple equals one.

18. The method of claim 15, wherein the given first phase-alignment element has the same geometry as the given second phase-alignment element.

19. The method of claim 15, wherein the distributed phase-correction circuit reduces duty-cycle jitter in the input signal and jitter associated with a fabrication process and a temperature variation.

20. The circuit of claim 1, wherein the first of the phase-alignment elements in the first delay line receives the input signal without any delay added to the input signal by the first delay line and outputs a delayed version of the input signal that is delayed by an inverse of an integer multiple of a half-period of the input signal,
wherein the cascaded phase-alignment elements in the first delay line are arranged in series, wherein the cascaded phase-alignment elements in the second delay line are arranged in series, wherein the first of the phase-alignment elements in the second delay line is first in the series of phase-alignment elements in the second delay line, and wherein the last of the of the phase-alignment elements in the first delay line is last in the series of phase-alignment elements in the first delay line.

* * * * *